US010388652B2

(12) United States Patent
Shi et al.

(10) Patent No.: US 10,388,652 B2
(45) Date of Patent: Aug. 20, 2019

(54) INTERGRATED CIRCUIT STRUCTURE INCLUDING SINGLE DIFFUSION BREAK ABUTTING END ISOLATION REGION, AND METHODS OF FORMING SAME

(71) Applicant: GLOBALFOUNDRIES INC., Grand Cayman (KY)

(72) Inventors: Yongiun Shi, Clifton Park, NY (US); Lei Sun, Altamont, NY (US); Laertis Economikos, Wappingers Falls, NY (US); Ruilong Xie, Schenectady, NY (US); Lars Liebmann, Mechanicville, NY (US); Chanro Park, Clifton Park, NY (US); Daniel Chanemougame, Niskayuna, NY (US); Min Gyu Sung, Latham, NY (US); Hsien-Ching Lo, Clifton Park, NY (US); Haiting Wang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/811,961

(22) Filed: Nov. 14, 2017

(65) Prior Publication Data
US 2019/0148373 A1 May 16, 2019

(51) Int. Cl.
*H01L 27/088* (2006.01)
*H01L 21/311* (2006.01)
(Continued)

(52) U.S. Cl.
CPC ...... *H01L 27/0886* (2013.01); *H01L 21/3086* (2013.01); *H01L 21/31144* (2013.01);
(Continued)

(58) Field of Classification Search
CPC combination set(s) only.
See application file for complete search history.

(56) References Cited

U.S. PATENT DOCUMENTS 6,383,931 B1  5/2002  Flanner et al.
8,846,491 B1  9/2014  Pham et al.
(Continued)

OTHER PUBLICATIONS

Branislav Curanovic, "Development of a fully-depleted thin-body FinFET process", (2003) Thesis. Rochester Institute of Technology. 130 pages.
(Continued)

*Primary Examiner* — Ratisha Mehta
(74) *Attorney, Agent, or Firm* — Francois Pagette; Hoffman Warnick LLC

(57) ABSTRACT

The disclosure provides integrated circuit (IC) structures with single diffusion break (SDB) abutting end isolation regions, and methods of forming the same. An IC structure may include: a plurality of fins positioned on a substrate; a plurality of gate structures each positioned on the plurality of fins and extending transversely across the plurality of fins; an insulator region positioned on the plurality of fins and laterally between the plurality of gate structures; at least one single diffusion break (SDB) positioned within the insulator region and one of the plurality of fins, the at least one SDB region extending from an upper surface of the substrate to an upper surface of the insulator region; and an end isolation region abutting a lateral end of the at least one SDB along a length of the plurality of gate structures, the end isolation region extending substantially in parallel with the plurality of fins.

14 Claims, 11 Drawing Sheets

(51) Int. Cl.
- *H01L 21/8234* (2006.01)
- *H01L 29/66* (2006.01)
- *H01L 29/06* (2006.01)
- *H01L 27/02* (2006.01)
- *H01L 21/762* (2006.01)
- *H01L 21/308* (2006.01)
- *H01L 21/3105* (2006.01)
- *H01L 21/027* (2006.01)

(52) U.S. Cl.
CPC ............ *H01L 21/76224* (2013.01); *H01L 21/823431* (2013.01); *H01L 21/823437* (2013.01); *H01L 21/823481* (2013.01); *H01L 27/0207* (2013.01); *H01L 29/0649* (2013.01); *H01L 29/66545* (2013.01); *H01L 21/0276* (2013.01); *H01L 21/31053* (2013.01); *H01L 21/31116* (2013.01); *H01L 29/6656* (2013.01)

(56) References Cited

U.S. PATENT DOCUMENTS

| | | |
|---|---|---|
| 8,916,460 B1 | 12/2014 | Kwon et al. |
| 9,171,752 B1 | 10/2015 | Wu et al. |
| 9,263,516 B1 | 2/2016 | Wu et al. |
| 9,337,099 B1 | 5/2016 | Jain et al. |
| 9,412,616 B1 | 8/2016 | Xie et al. |
| 9,412,660 B1* | 8/2016 | Xie ............... H01L 21/76897 |
| 9,425,252 B1 | 8/2016 | Zang et al. |
| 9,406,676 B2 | 9/2016 | Yu et al. |
| 9,653,579 B2 | 5/2017 | Liu et al. |
| 9,653,642 B1 | 5/2017 | Raring et al. |
| 2009/0081815 A1 | 3/2009 | Yamashita et al. |
| 2009/0242513 A1 | 10/2009 | Funk et al. |
| 2010/0036518 A1 | 2/2010 | Funk et al. |
| 2013/0311231 A1 | 11/2013 | Morinaga et al. |
| 2014/0001572 A1 | 1/2014 | Bohr et al. |
| 2014/0117454 A1 | 5/2014 | Liu et al. |
| 2015/0104918 A1 | 4/2015 | Liu et al. |
| 2015/0171082 A1 | 6/2015 | Choi et al. |
| 2016/0110489 A1 | 4/2016 | Schroeder et al. |
| 2016/0111524 A1 | 4/2016 | Ha et al. |
| 2016/0133632 A1 | 5/2016 | Park et al. |
| 2016/0190130 A1 | 6/2016 | Yu et al. |
| 2017/0005169 A1 | 1/2017 | Loubet et al. |
| 2017/0051884 A1 | 2/2017 | Raring et al. |
| 2017/0096777 A1 | 4/2017 | Park et al. |
| 2017/0098581 A1 | 4/2017 | Ho et al. |
| 2017/0236712 A1 | 8/2017 | Hsieh et al. |
| 2017/0256458 A1* | 9/2017 | Chang ............ H01L 21/823456 |
| 2018/0108749 A1 | 4/2018 | Greene et al. |

OTHER PUBLICATIONS

Chiao-Ti Huang, "Electrical and Material Properties of Strained Silicon/Relaxed Silicon Germanium Heterostructures for Single-Electron Quantum Dot Applications", A Dissertation Presented to the Faculty of Princeton University in Candidacy for the Degree of Doctor of Philosophy, 127 pages (Jun. 2015).

Yu-Chih Tseng, "Interfaces and Junctions in Nanoscale Bottom-Up Semiconductor Devices", Electrical Engineering and Computer Sciences University of California at Berkeley Technical Report No. UCB-EECS-2009-65, 120 pages (May 17, 2009).

U.S. Appl. No. 15/811,957, Notice of Allowance dated Jul. 2, 2018, 20 pages.

Wen et al., "CMOS Junctionless Field-Effect Transistors Manufacturing Cost Evaluation," IEEE Transactions on Semiconductor Manufacturing, vol. 26, No. 1, Feb. 2013, 7 pages.

U.S. Appl. No. 15/811,953, Notice of Allowance dated Sep. 6, 2018, 17 pages.

Khalil et al., "A Self-Calibrated On-Chip Phase-Noise Measurement Circuit With—75 dBc Single-Tone Sensitivity at 100 kHz Offset," IEEE Journal of Solid-State Circuits, vol. 42, No. 12, Dec. 2007, 8 pages.

Warren F. Walls, "Cross-Corelation Phase Noise Measurements," IEEE Frequency Control Symposium, 1992, pp. 257-261.

U.S. Appl. No. 15/811,965, Notice of Allowance dated May 15, 2019, 10 pages.

* cited by examiner

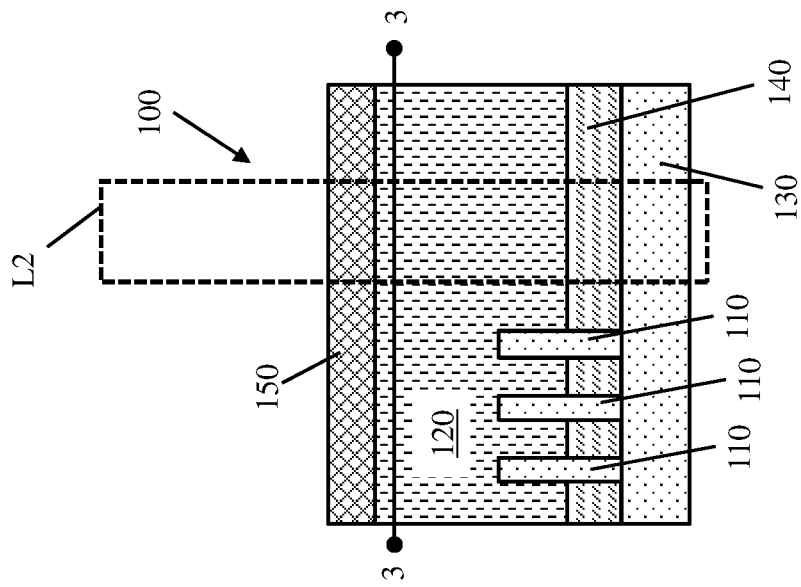
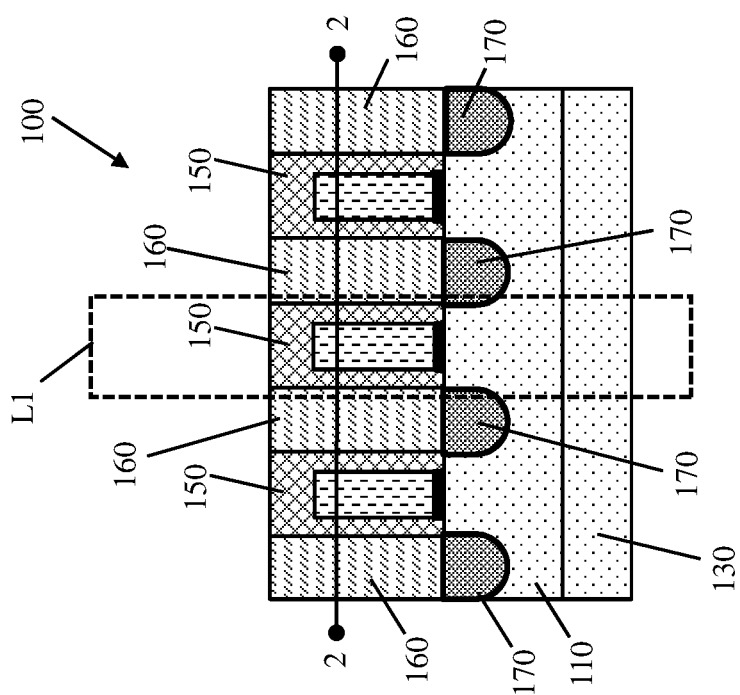
FIG. 3
FIG. 2

INTERGRATED CIRCUIT STRUCTURE INCLUDING SINGLE DIFFUSION BREAK ABUTTING END ISOLATION REGION, AND METHODS OF FORMING SAME

BACKGROUND

Technical Field

The present application relates to methods of forming integrated circuit (IC) structures with varying isolation features, and structures associated with the disclosed methods. More particularly, the present application relates to processing techniques for creating single diffusion break (SDB) which abuts an end isolation region in an IC structure with a reduced number of masks as compared to conventional techniques.

Related Art

Design systems are commonly used to design integrated circuits (ICs) and, in particular, to design front end of line (FEOL) components. As advances occur, smaller widths for wires and vias are provided. Additional design constrains imposed by smaller wire and via widths, e.g., requirements for uni-directional wiring at any metal layer, may preclude the use of non-linear wiring in a metal layer. The intended circuit structure must comply with these design rules before manufacture. Design rule spacing constraints can limit a variety of attributes, e.g., the maximum separation distance between adjacent gates in a cell array. Such constraints can affect the ability to form functional elements which connect gates and/or other structures together, e.g., two or more vias connecting to nearby positions of a single device layer.

To separate the various functional components of a product from each other, it may be necessary to form one or more isolation regions between two or more conductive or semiconductor regions of the product. Some isolation regions may be positioned over different types of components, e.g., over other insulating regions or over functional components. To accommodate the different locations and types of isolation regions, it is generally necessary to fabricate a different mask for each isolation structure and include various structural features, intermediate components, etc., to protect previously-formed structures or other regions from being processed to yield additional isolation regions. The structural differences at each location where an isolation region is needed may prevent the use of a single mask to form multiple types of isolation regions in the same structure.

SUMMARY

A first aspect of the disclosure provides an integrated circuit (IC) structure, including: providing a structure including: providing a structure including: a plurality of fins positioned on a substrate, a plurality of shallow trench isolations (STIs) each positioned on the substrate laterally adjacent to one of the plurality of fins, and a masking layer positioned on the plurality of fins and the plurality of STIs; forming a first trench in the masking layer to expose the plurality of fins, wherein the first trench extends transversely across the plurality of fins; forming a second trench within the masking layer to expose one of the plurality of STIs, the second trench extending substantially in parallel with the plurality of fins, and wherein the second trench is positioned at a lateral end of the first trench; forming a first opening within at least one of the exposed fins of the first trench to expose the substrate thereunder; forming a second opening within the exposed one of the plurality of STIs of the second trench without exposing the substrate thereunder; and forming an insulator on the exposed substrate and the exposed one of the plurality of STIs.

A second aspect of the disclosure provides a method of forming an integrated circuit (IC) structure, the method including: providing a structure including: a plurality of fins positioned on a substrate, a plurality of shallow trench isolations (STIs) each positioned on the substrate laterally adjacent to one of the plurality of fins, and a set of gate structures positioned on the plurality of fins and extending transversely across the plurality of fins; removing the set of gate structures from the structure; forming a gate coating on the structure, after removing the set of gate structures; forming a masking layer on the gate coating, after removing the set of gate structures; forming a first trench within the masking layer to expose a portion of one of the plurality of fins, the first trench extending transversely across the plurality of fins; forming a second trench within the masking layer to expose one of the plurality of STIs, the second trench extending substantially in parallel with the plurality of fins, and positioned at a lateral end of the first trench; forming a first opening within the exposed portion of one of the plurality fins, within the first trench to expose the substrate thereunder; forming a second opening within the exposed one of the plurality of STIs of the second trench without exposing the substrate thereunder; and forming an insulator on the exposed substrate and the exposed one of the plurality of STIs.

A third aspect of the disclosure provides a method of forming an integrated circuit (IC) structure, including: a plurality of fins positioned on a substrate; a plurality of gate structures each positioned on the plurality of fins and extending transversely across the plurality of fins; an insulator region positioned on the plurality of fins and laterally between the plurality of gate structures; at least one single diffusion break (SDB) positioned within the insulator region and one of the plurality of fins, the at least one SDB region extending from an upper surface of the substrate to an upper surface of the insulator region; and an end isolation region abutting a lateral end of the at least one SDB along a length of the plurality of gate structures, the end isolation region extending substantially in parallel with the plurality of fins.

BRIEF DESCRIPTION OF THE DRAWINGS

The embodiments of this disclosure will be described in detail, with reference to the following figures, wherein like designations denote like elements, and wherein:

FIG. 2 shows a lateral cross-sectional view of the structure along line 2-2 of FIG. 1 according to the disclosure.

FIG. 3 shows a longitudinal cross-sectional view of the structure along line 3-3 of FIG. 1 according to the disclosure.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

Figure 1:
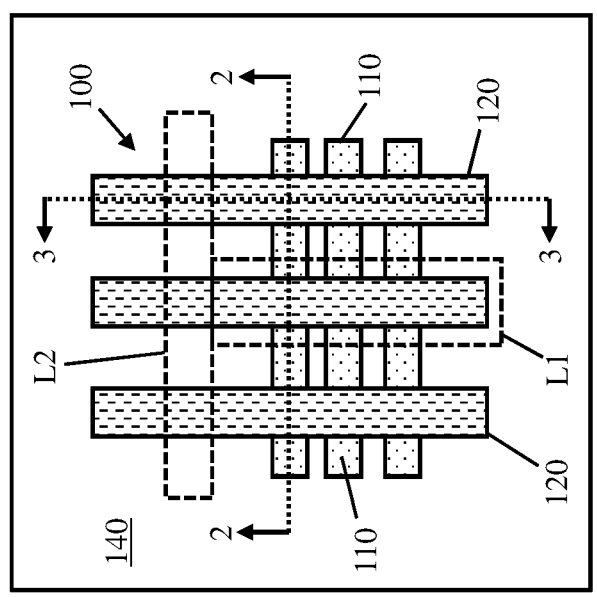
FIG. 1 shows a plan view of an initial structure to be processed according to the disclosure.

FIG. 1 provides a plan view of a structure 100 to be processed according to the present disclosure. The example structure 100 of FIG. 1 illustrates one preliminary set of materials targeted for use with embodiments of the disclosure, but it is understood that embodiments of the disclosure can be implemented on different designs without any change to the techniques discussed herein. Structure 100 can include a set (i.e., one or more) of fins 110 extending in a first direction, with three fins 110 being provided for the sake of example. Structure 100 may also include a set (i.e., one or more) gate structures 120 extending transversely over fins 110, with each gate structure 120 having one or more regions positioned over corresponding fin(s) 110 in structure 100. A shallow trench isolation 140 (shown without cross-hatching in FIG. 1 solely for clarity) of structure 100, may be positioned underneath and/or adjacent to fin(s) 110 and gate structure(s) 120. A design rule for a product may include two locations L1, L2, where gate structures 120 must be removed for replacement with an electrically insulator material, e.g., a diffusion break for electrically separating two portions of the same fin, or an end isolation region (also known as a "gate cut region") for laterally separating two functional gates from each other. Portions of gate structure 120 in first location L1 may represent a dummy gate positioned over the targeted location of a single diffusion break. Forming a single diffusion break in first location L1 will isolate active regions on opposite side of the single diffusion break from each other. Portions of gate structure 120 in second location L2 may represent an eventual end isolation region or "gate cut region," where underlying materials will be removed and replaced with insulator materials. Although a first location L1 and two second locations L2 are shown in FIG. 1 for the purposes of example, it is understood that multiple first locations L1 and/or a single second location L2 may be processed according to the disclosure without modifying or otherwise departing from the various techniques discussed herein.

Referring to FIGS. 2-3, together, the various components of structure 100 are discussed in further detail to better illustrate subsequent processing in embodiments of the disclosure. First and second locations L1, L2 are also depicted in FIGS. 2-3 for correspondence with FIG. 1. Each fin 110 can be formed from an underlying semiconductor substrate 130, e.g., by removing targeted portions of substrate 130 to a predetermined depth, causing the non-removed portions to form fins 110 directly on substrate 130. Substrate 130 can include, e.g., one or more currently-known or later developed semiconductor substances generally used in semiconductor manufacturing, including without limitation: silicon (e.g., crystal silicon), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity).

Structure 100 may include at least one shallow trench isolation (STI) 140 (FIG. 3 only) positioned on substrate 130, as well as between fins 110 and gate structures 120. Each STI 140 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Each gate structure 120 may take the form of a non-functional gate or placeholder structure, e.g., one or more dummy gates to be processed at a different stage of forming a product. Such components may be eventually replaced with functional elements in other process steps. Gate structures 120 thus may cover one or more semiconductor fins 110 positioned above substrate 130, e.g., by coating exposed sidewalls and an upper surface of fin(s) 110. Gate structure(s) 120 can also include corresponding gate spacers 150. Gate spacer(s) 150 can be provided as one or more bodies of insulating material formed on exposed portions of STI(s) 140 and/or gate structure(s) 120, e.g., by deposition, thermal growth, etc., and may include materials and/or other structures formed on or adjacent to gate structure(s) 120 to electrically and physically insulate gate structure(s) 120 from other components of structure 100. In an example embodiment, gate spacer(s) 150 can be provided as a region of silicon nitride (SiN) with or without other insulating materials being included therein. The lateral space between gate spacer(s) 150 in structure 100 can be occupied by one or more inter-level dielectric (ILD) regions 160, which may include the same insulating material as STI(s) 140 or may include a different electrically insulator material. STI(s) 140 and ILD region 160 nonetheless constitute different components, e.g., due to STI(s) 140 being formed before gate structure(s) 120, and ILD region 160 being formed on fin(s) 110, gate structure(s) 120, and STI(s) 140 together.

As shown specifically in FIG. 2, each fin 110 can include a set of epitaxial regions 170 positioned below ILD regions 160 and adjacent to gate structures 120. Epitaxial regions 170 may be formed within fin 110, e.g., by forming openings within fin 110 and epitaxially growing another semiconductor material within the openings, thereby forming epitaxial regions 170 with a different material composition from the remainder of fin 110. Gate structures 120 and their spacers 150 may shield a portion of the fin 110 when epitaxial regions 170 are being formed. Epitaxial regions 170 may initially include the same semiconductor material of fin 110, or a different semiconductor material before being implanted with dopants. Implanting dopants into epitaxial regions 170 may form the eventual source/drain regions of a device formed from structure 100. Epitaxial regions 170, after being implanted with dopants, may have a different composition from the remainder of fin 110. To form epitaxial regions 170, selected portions of fin 110 may be implanted with a strain-inducing material, such as silicon germanium or silicon carbon, formed on fins composed of silicon, silicon germanium, and/or silicon carbon. The dopants used to form epitaxial regions 170 may be doped in situ or an implantation process may be performed to affect only epitaxial regions 170 of structure 100. According to an example, fin 110 is not previously doped before epitaxial regions 170 are formed within structure 100. A dopant implantation process may be performed to dope both fin(s) 110 and epitaxial regions 170. If a lightly doped source/drain region is desired, the dopant implantation can occur after forming gate structures 120, but before forming spacer(s) 150. Further illustration of methods according to the disclosure is provided by reference to a lateral cross-section of FIG. 1 (e.g., along line 3-3), depicted in odd-numbered FIGS. 5, 7, 9, 11, 13, and 15, and a longitudinal cross-section of FIG. 1 (e.g., along line 4-4), depicted in even-numbered FIGS. 4, 6, 8, 10, 12, and 14.

Figure 5:
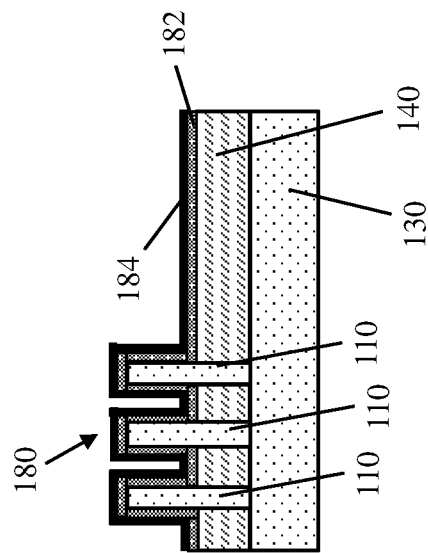
FIG. 5 shows, along the longitudinal lateral cross-section, removing gate structures and forming a gate coating according to the disclosure.
Figure 4:
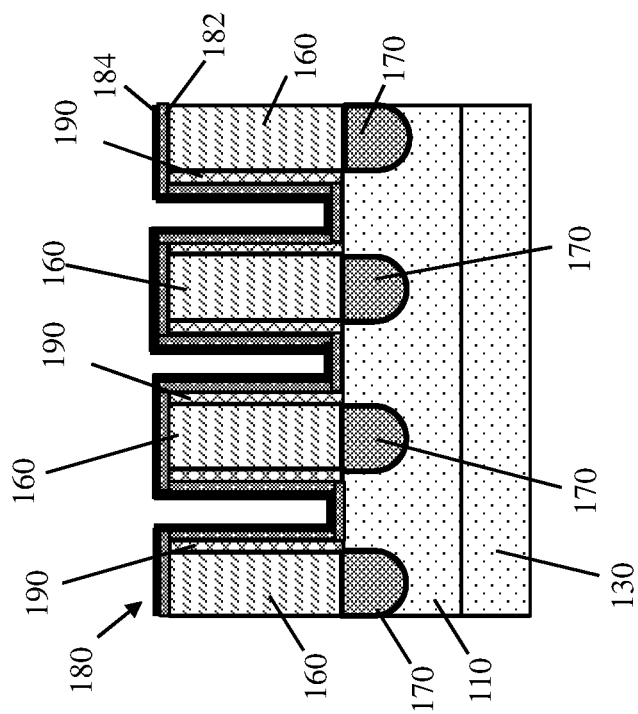
FIG. 4 shows, along the lateral cross-section, removing gate structures and forming a gate coating according to the disclosure.

Turning to FIGS. 4 and 5, targeted gate structure(s) 120 (FIGS. 1-3) may need to be removed and replaced with new materials to provide the various regions of insulator material, e.g., one or more single diffusion breaks and/or end isolation regions. Removing one or more gate structure(s) 120 (FIGS. 1-3) can also uncover underlying structures targeted for removal (e.g., fin(s) 110, STI(s) 140, etc.) as described herein. Other portions of gate structures not targeted for removal (e.g., portions of gate structure(s) 120 not included within first and second locations L1, L2) may be left intact as processing according to the disclosure contin-ues. To target one or more gate structure(s) 120 of structure 100 for removal, the disclosure may include a selective etching of gate structure(s) 120 via one or more etchants selective to semiconductor materials and/or other portions of gate structures 120. Additional or alternative techniques for removing gate structures 120 may include forming a mask (not shown) on the upper surface of structure 100, e.g., by depositing one or more layers of masking materials to provide a targeted etching and removal of gate structures 120 from the structure. Removing gate structures 120 can create empty space between ILD regions 160 above fins 110 (FIG. 4), and between fins 110 above STI(s) 140 (FIG. 5).

After removing gate structure(s) 120, further processing may include forming a gate coating 180 on exposed surfaces of fin(s) 110, STI(s) 140, and insulator regions 160. Gate coating 180 may include one or more materials structured for use within a functional metal gate of a transistor, and/or may include other materials for permitting subsequent deposition and/or growth of other materials thereon. According to an embodiment, gate coating 180 may include a gate dielectric layer 182, e.g., silicon oxide ($SiO_2$), hafnium oxide ($HfO_2$), zirconium silicate ($ZrSiO_4$), and/or other types of dielectric materials. Gate coating 180 may additionally include one or more layers of conductive material, e.g., a high work function metal layer 184, positioned on gate dielectric layer 182. High work function metal layers 184 appropriate for use in gate coating 180 may include, e.g., cobalt (Co), beryllium (Be), gold (Au), etc. Thus, the composition of gate coating 180 may be subdivided into gate dielectric layer 182 and high work function metal layer 184 structure for eventual use in the gate of a FinFET transistor. As also shown by example, some portions of gate spacer(s) 150 (FIGS. 1-3) may remain intact after gate structure(s) 120 have been removed, e.g., due to differences in the etch selectivity of gate spacer(s) 150. The remaining spacer materials may remain intact as a spacer liner 190 (FIG. 4) on the sidewalls of each ILD region 160.

Figure 7:
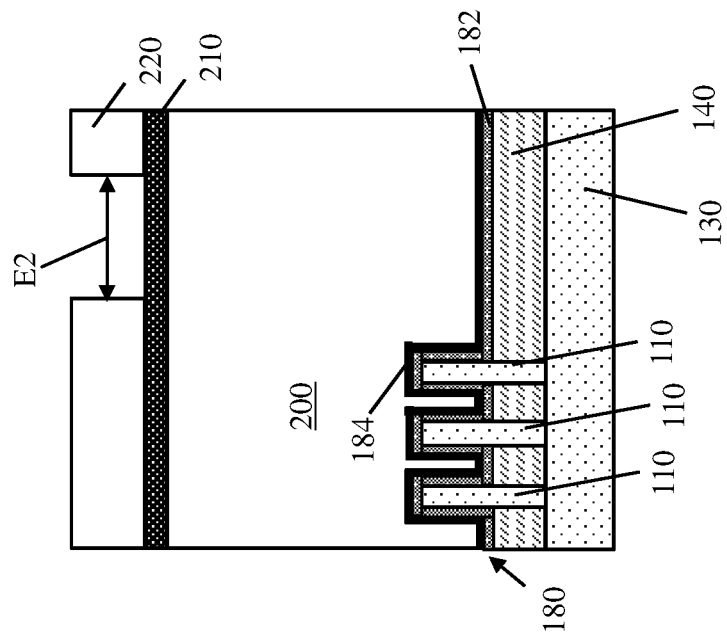
FIG. 7 shows, along the longitudinal cross-section, forming a soft mask and photoresist layer according to the disclosure.
Figure 6:
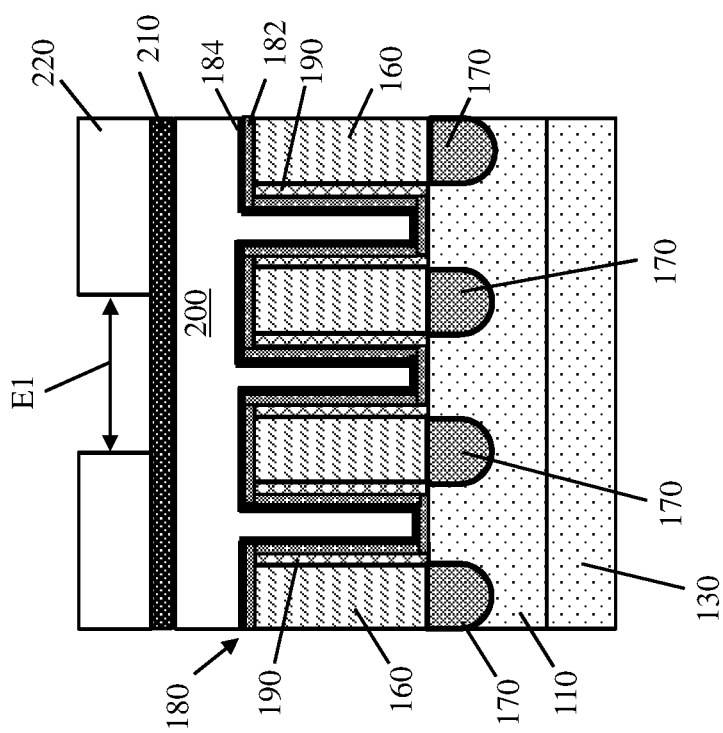
FIG. 6 shows, along the lateral cross-section, forming a soft mask and photoresist layer according to the disclosure.

Turning to FIGS. 6 and 7, further processing may include forming intermediate structures to identify and process various locations where insulating materials will be formed in a resulting structure. Soft mask layer 200 may be formed on gate coating 180, e.g., directly on high work function metal layer 184, and may include any currently known or later developed soft masking material, e.g., an organic planarization layer (OPL), amorphous carbon (aC), a spin-on-hardmask (SOH), and/or other layers of various hard or soft mask materials. As examples, masking layer 200 may be formed by deposition techniques such as spin on deposition, i.e., a process used to deposit uniform thin films on a structure, or other non-conformal depositing techniques. The amount of deposited material may be controlled such that masking layer 200 completely covers gate dielectric layer 182 and high work function metal 184 of gate coating 180, in addition to covering each fin 110, STI(s) 140 and ILD regions 160. In the example of FIGS. 6 and 7, the upper surface of masking layer 200 is positioned above the upper surface of fins 110 and ILD regions 160 to provide a targeted insulator formation relative to these materials.

Targeting different materials for insulator formation may include forming an anti-reflective coating 210 on masking layer 200. The composition of anti-reflective coating 210 may include any currently known or later developed substance selected for permitting light passage therethrough, and/or for allowing additional anti-reflective films to be formed thereon. Examples of such materials suitable for anti-reflective coating 210 may include, e.g., a silicon-containing antireflective coating (SiARC), a silicon oxynitride (SiON) material, one or more bottom anti-reflective coatings (BARC), a low temperature oxide (LTO) material, a titanium-based coating (e.g., TiOx, TiARC), and/or other masking materials.

The disclosure may include forming a photoresist layer 220 on anti-reflective coating 210. The term "photoresist layer" or "photoresist material," as used herein, refers to any currently known or later developed photo-sensitive material used in photolithography to transfer a pattern from a mask onto a wafer. Photoresist materials may include liquids deposited on the surface of the wafer as a thin film, which is then solidified by low temperature anneal. Photoresist layer 210 may be used to pattern underlying portions of masking layer 200 and anti-reflective coating 210 from their initial form in order to uncover and target some portions of gate coating 180, and corresponding portions of fin(s) 110 and STI(s) 140, for additional processing. As shown, photoresist layer 220 may be formed to include a first opening E1 (FIG. 6) positioned over fin(s) 110, and a second opening E2 (FIG. 7) positioned over STI(s) 140. Each opening E1, E2 may have a similar lateral width or different lateral width based on the size underlying materials to be removed. According to an example, each opening E1, E2 in photoresist layer 220 may have a width of at most approximately 30 (nm). It is noted that openings E1, E2 may have substantially the same area profile as locations L1, L2 depicted in FIG. 1, and thus may laterally intersect each other as shown in FIG. 1 or may define two regions of a single, combined opening in photoresist layer 220.

Figure 9:
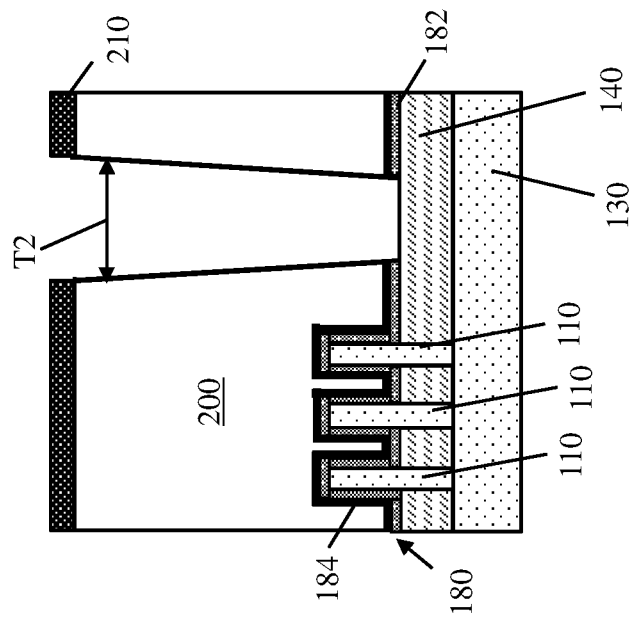
FIG. 9 shows, along the longitudinal cross-section, forming a second trench in the soft mask according to the disclosure.
Figure 8:
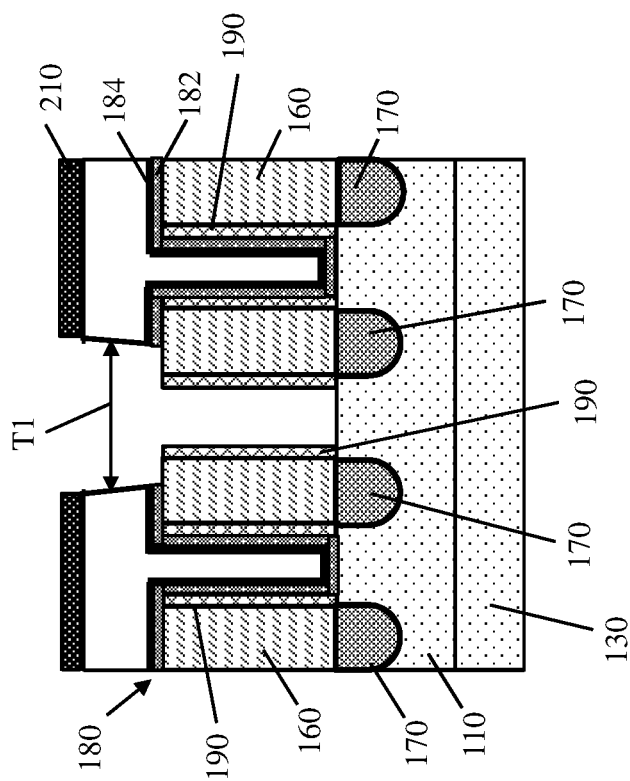
FIG. 8 shows, along the lateral cross-section, forming a first trench in the soft mask according to the disclosure.

FIGS. 8 and 9 depict the etching of anti-reflective coating 210 and masking layer 200 beneath openings E1, E2 (FIGS. 6 and 7) in photoresist layer 230 (FIGS. 6 and 7) to expose underlying portions of gate coating 180 positioned on corresponding fin(s) 110 and STI(s) 140. Portions of masking layer 200 exposed within openings E1, E2 can be removed by way of a selective or non-selective vertical etching, such that photoresist layer 230 protects other areas of masking layer 200 from being removed. The portions of gate coating 180 (including, e.g., gate dielectric layer 182 and/or high work function metal layer 184) located beneath openings E1, E2 in photoresist layer 230 may also be selectively removed in subsequent processing by way of an isotropic etch. FIGS. 8 and 9 thus depict both the removing of masking layer 200 within openings E1, E2, and the subsequent selective etching of gate coating 180 beneath the removed portions of masking layer 200.

Figure 16:
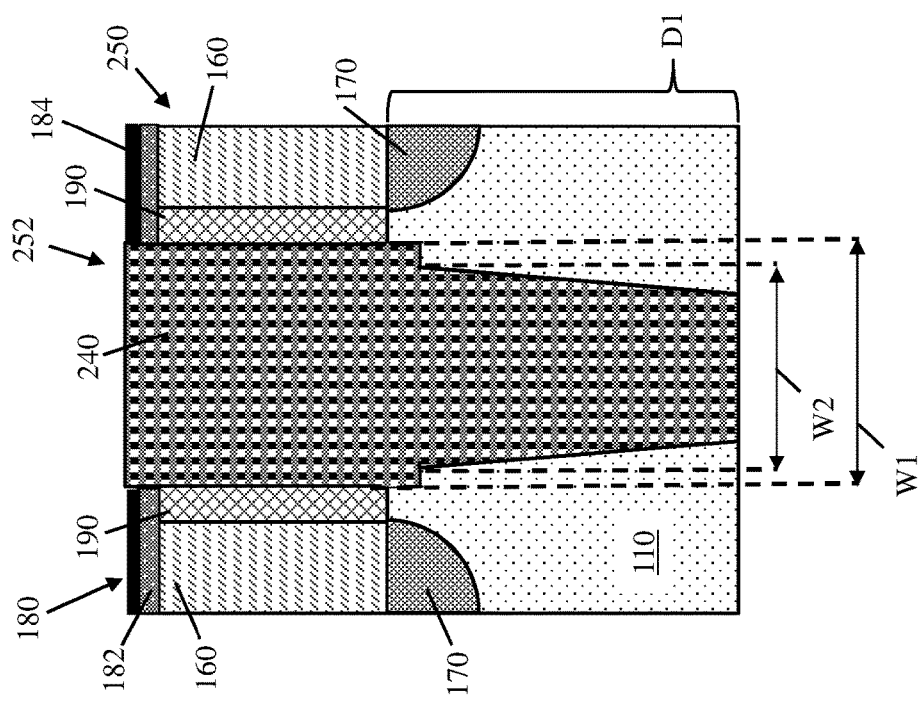
FIG. 16 shows a magnified lateral cross-section of an SDB according to the disclosure.

Removing portions of masking layer 200 beneath opening(s) E1 (FIGS. 6 and 7), and a subsequent isotropic etch of gate coating 180, may form a first trench T1 (FIG. 8 only) in masking layer 200 to expose fins 110 thereunder. Although one fin 110 is shown in the cross-section of FIG. 8, first trench T1 extends longitudinally into and out of the plane of the page to expose other fins 110 located within other lateral cross-sections. The shape of first trench T1 thereby allows insulating materials to be formed over multiple fins 110, e.g., within the surface area of first location L1 (FIG. 1), and as depicted in FIG. 16 and discussed elsewhere herein. In the same etching process, portions of masking layer 200 beneath opening(s) E2 (FIGS. 6 and 7) may be removed to form a second trench T2 (FIG. 9 only) in masking layer 200, exposing a portion of STI(s) 140 thereunder. Portions of gate coating 180 may also be removed by way of isotropic etching or other techniques appropriate for removing gate dielectric layers 182 and/or high work function metal layers 184. The isotropic etch of gate coating 180 may cause sidewall surfaces of masking layer 200, and other materials previously covered by gate coating 180 (e.g., gate spacers 190) to become exposed. Second trench T2 similarly extends in a lateral direction (i.e., substantially parallel to the orientation of fins 110), into and out of the plane of the page. Second trench T2 may be shaped and positioned for insulating material to be formed on STI(s) 140 at a location displaced from fin(s), e.g., within the surface area of second location L2 (FIG. 1), and as depicted in FIG. 16 and discussed elsewhere herein. Thus, second trench T2 laterally abuts one longitudinal end of first trench T1, such that both trenches T1, T2 may form portions of a single opening within masking layer 200. In addition, first and second trenches T1, T2 may have a substantially tapered profile (e.g., exhibiting a gradually reduced width with proximity to fins 110 or STI(s) 140) as a result of being formed with the aid of photoresist layer 230 (FIGS. 6 and 7).

Figure 11:
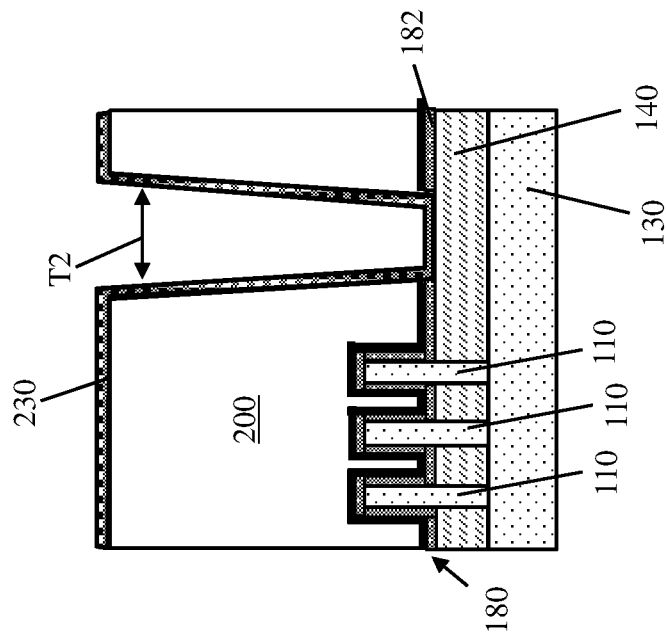
FIG. 11 shows, along the longitudinal cross-section, forming a dielectric liner within second trench according to the disclosure.
Figure 10:
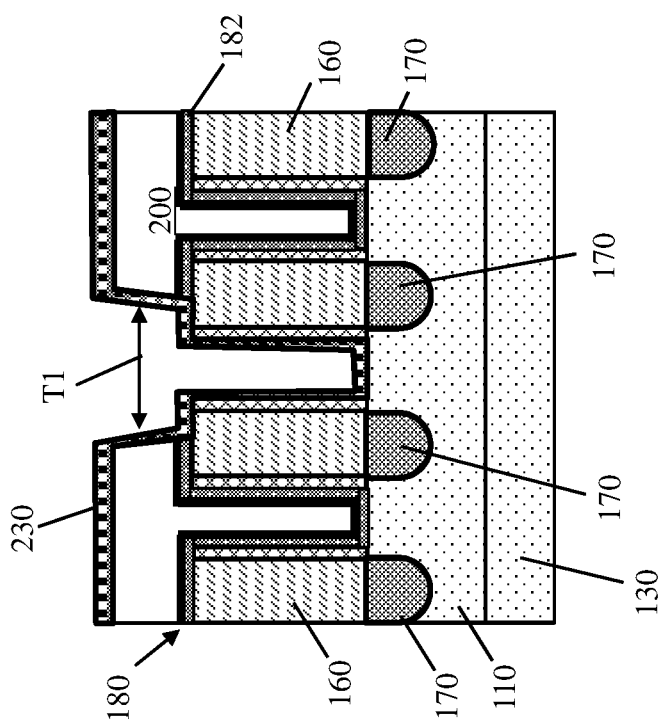
FIG. 10 shows, along the lateral cross-section, forming a dielectric liner within first trench according to the disclosure.

Proceeding to FIGS. 10 and 11, continued processing may include forming additional materials, e.g., a dielectric liner 230, on the surfaces of exposed structures, e.g., at least within first and second trenches T1 (FIG. 10 only), T2 (FIG. 11 only). As an initial procedure, anti-reflective coating 210 may be removed from masking layer 200 after trenches T1, T2 have been formed. Techniques appropriate for removing anti-reflective coating 210 (FIGS. 6-9) may include stripping, ashing, and/or other processes for selectively removing anti-reflective materials without affecting other exposed materials. Dielectric liner 230 may be formed by any currently known or later developed procedure of forming an electrically insulator material on an exposed surface, and in one example may include selective or non-selective conformal deposition on semiconductor materials (e.g., fins 110) and/or insulator materials (e.g., STI(s) 140, spacer liners 190, masking layer 200). Upon being formed, dielectric liner 230 may have a thickness that is substantially less than the total width of trenches T1, T2 (e.g., between approximately 3.0 nm and approximately 6.0 nm). Portions of each trench T1, T2 thus may remain unoccupied by insulator material when dielectric liner 230 is formed. Dielectric liner 230 may nonetheless cover each exposed surface of fin(s) 110, STI(s) 140, spacer liners 190, masking layer 200 within trenches T1, T2 after being formed within trenches T1, T2. The composition of dielectric liner 230 may be similar to that of STI(s) 140 and/or ILD regions 160, or may include different insulator materials. According to one example, dielectric liner 230 may be different from STI(S) 140 and/or ILD regions 160 composed of oxide compounds by being formed from silicon nitride (SiN) or other nitride insulators with similar electrically insulating properties.

Figure 12:
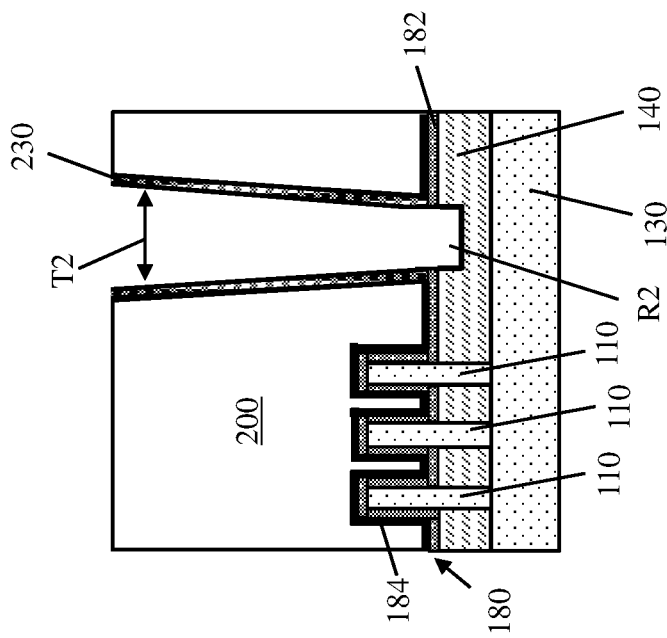
FIG. 12 shows, along the lateral cross-section, forming a first opening below the first trench according to the disclosure.
Figure 13:
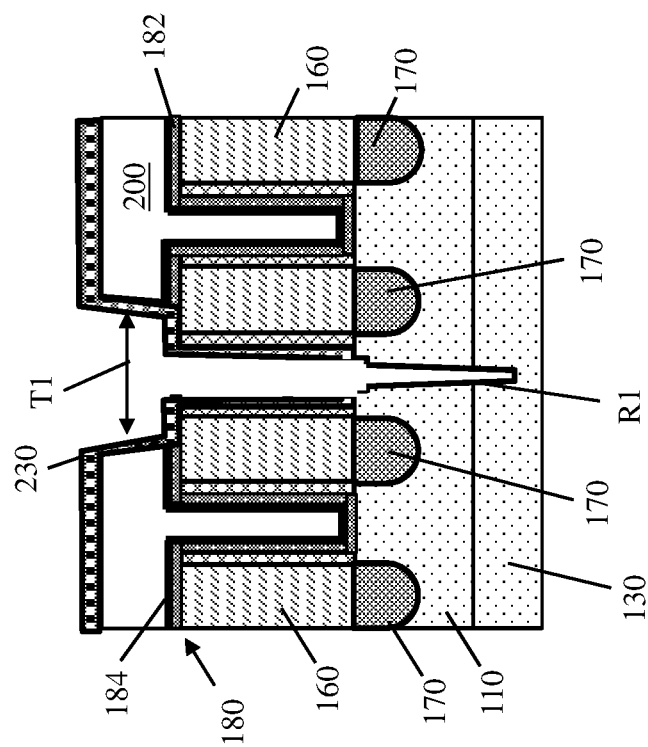
FIG. 13 shows, along the longitudinal cross-section, forming a second opening below the second trench according to the disclosure.

Turning now to FIGS. 12 and 13, the design of a product may require electrical isolation of portions of one fin 110 from each other in addition to the longitudinal electrical separation of different functional gates. To provide this structural and electrical separation, trenches T1, T2 may be modified and expanded to extend into other underlying layers. As shown in FIG. 12, methods according to the disclosure may include vertically etching first trench T1 (FIG. 12 only) and second trench T2 (FIG. 13 only) to remove underlying portions of material. The vertical etching may include, e.g., reactive ion etching (RIE), a variation of plasma etching in which the etched material takes on an electrical potential to accelerate etchants vertically toward the surface of the etched material. Applying RIE or a similar vertical etching may remove dielectric liner 230 from the planar upper surface of masking layer 200 and at the bottom of trenches T1 (FIG. 12) and T2 (FIG. 13) while leaving at least a portion of dielectric liner 230 intact on the sidewalls of each trench T1, T2. Thus, RIE or vertical etching may remove dielectric liner 230 from the bottoms of each trench T1, T2 to expose a portion of fins 110 and STI(s) 140 thereunder.

The removed portions of fin 110, and underlying removed portions of substrate 130 (where applicable) may together form a first opening R1 within fin(s) 110 and substrate 130. The removed portions of STI(s) 140 beneath second trench T2 may similarly form a second opening R2 within STI(s) 140. The prior forming of dielectric liner 230, e.g., with one or more dielectric liners therein, may protect the coated portions of masking layer 200 from being removed via RIE or other etching processes as openings R1, R2 are formed. Specifically, dielectric liner 230 may prevent lateral expansion of trenches T1, T2 (known in the art as "lateral blow up") as each opening R1, R2 is formed. Vertical etching may cause openings R1, R2 to have a substantially rectangular profile as compared to trenches T1, T2, which may be formed by different types of etching as noted elsewhere herein. As shown by a comparison between FIGS. 12 and 13, the use of RIE or similar vertical etching may cause second opening R2 to have a smaller depth below STI(s) 140 as compared to the depth of first opening R1 within fin(s) 110 and substrate 130. The difference in depth between each opening R1, R2 may stem from differences in the etch rate of STI(s) 140 as compared to the semiconductor materials within fin(s) 110 and substrate 130. The differences in etch rate between fin(s) 110 and STI(s) 140 may also cause first opening R1 to exhibit an inwardly-tapered cross sectional profile through fin(s) 110, while causing second opening R2 to have a substantially rectangular profile within STI(s) 140. These structural differences between each opening R1, R2 may cause first opening(s) R1 to be particularly suited to forming SDB regions while causing second opening(s) R2 to be particularly suited to forming end isolation regions.

Figure 15:
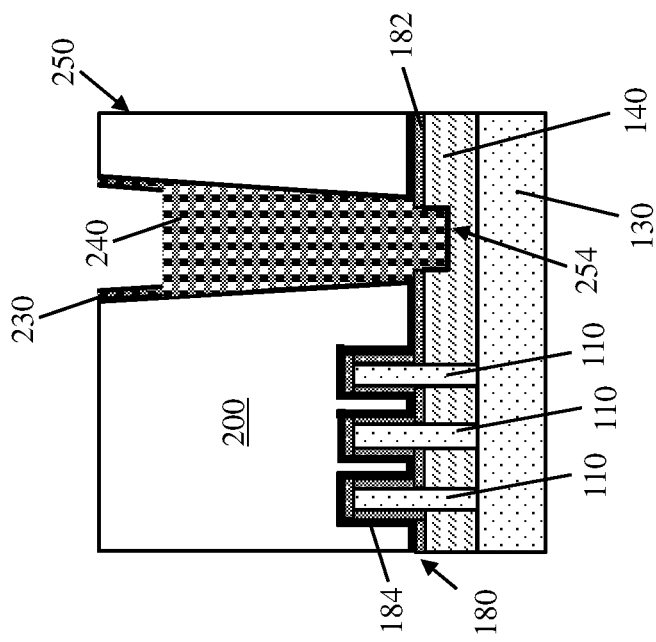
FIG. 15 shows, along the longitudinal cross-section, forming an insulator within the second trench and second opening according to the disclosure.
Figure 14:
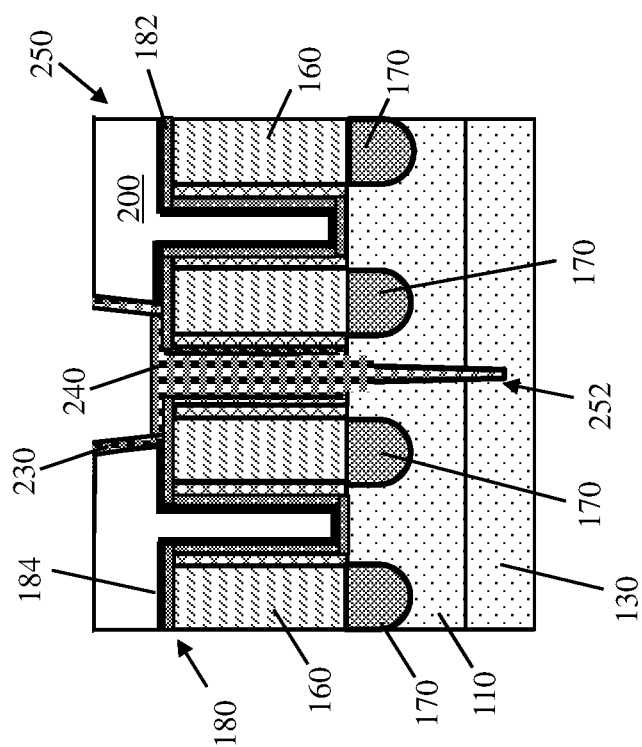
FIG. 14 shows, along the lateral cross-section, forming an insulator within the first trench and first opening according to the disclosure.

Referring now to FIGS. 14 and 15 together, continued processing according to the disclosure may include forming an insulator material within trenches T1 (FIGS. 8, 10, 12) and T2 (FIGS. 9, 11, 13), and within openings R1 (FIG. 12) and R2 (FIG. 13). According to an embodiment, each trench T1, T2 and opening R1, R2 may be filled with an insulator 240 composed of, e.g., one or more insulator materials included in dielectric liner(s) 230 or a different insulating material. In a particular example, both dielectric liner 230 and insulator 240 may include silicon nitride (SiN) or one or more other nitride insulators. Insulator 240 may additionally or alternatively include an oxide-based insulator and/or other materials configured to inhibit or prevent the transmission of electric currents therethrough. Insulator 240 may be formed by way of non-selective or selective deposition to fill opening(s) R1, R2 and trenches T1, T2, and in the case of non-selective deposition may cause insulator 240 to cover masking layer 200 after filling trenches T1, T2. For instance, methods according to the disclosure may include applying chemical mechanical planarization (CMP) to remove any portions of insulator 240 positioned on and above masking layer 200, causing the upper surface of insulator 240 to be substantially coplanar with the upper surface of masking layer 200. In the case of selective deposition, insulator 240 can be formed selective on semiconductor materials (e.g., fins 110 and substrate 130), and other insulating materials with the same or similar composition (e.g., portions of dielectric liner 230 and/or STI(s) 140), without additional insulator material being formed in direct contact with masking layer 200.

Referring to FIGS. 14 and 15 together, forming insulator 240 within trenches T1 (FIGS. 8, 10, 12) and T2 (FIGS. 9, 11, 13), and openings R1 (FIG. 12) and R2 (FIG. 13) may yield an IC structure 250 according to the disclosure. As shown specifically in FIG. 14, portions of insulator 240 positioned on and within fins 110 may form a single diffusion break (SDB) region 252 within structure 250, e.g., to electrically separate two semiconductor regions of one fin 110 from each other. Other portions of insulator 240 not positioned over and within fins 110, e.g., above STI(s) 140, may form end isolation regions 254 (FIG. 15) positioned at a lateral end of any remaining gate structure(s) 120, and extending substantially in parallel with fins 110. The processes discussed herein may particularly suitable for creating end isolation region(s) 254 laterally abutting and positioned at a longitudinal end of one or more SDB regions 252. End isolation region(s) 254 thus may divide the remaining gate structure(s) 120 into laterally distinct regions, each isolated from each other by insulator 240 within end isolation region(s) 254. Although SDB region(s) 252 and end isolation region(s) 254 each may represent portions of one insulator 240, they may provide different structural purposes in these locations. During subsequent processes for replacing gate structure(s) 120 with electrically functional gates and/or other components, end isolation region(s) 254 may continue to structurally and electrically separate the replacement components from each other. Thus, methods according to the disclosure provide a unified process of forming SDB regions 252 and end isolation regions 254 with the same material (e.g., masking layer 200), and with a single implementation of the various etching and deposition processes described herein. Again, it is noted that the number of SDB regions 252 and end isolation regions 254 may vary between implementations, and that insulator 240 may be deposited to form only a single SDB region 252 or end isolation region 254, as well as multiple SDB regions 252 or end isolation regions 254 to suit different products and/or intended functions.

Figure 17:
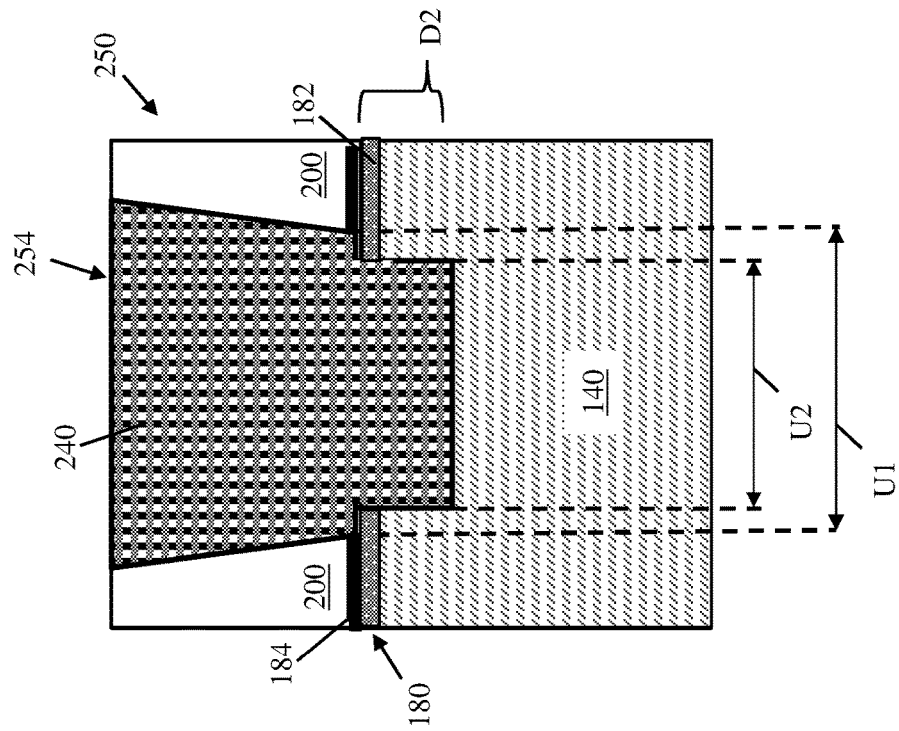
FIG. 17 shows a magnified longitudinal cross-section of an end isolation region according to the disclosure.

Referring to FIGS. 16 and 17, magnified lateral (FIG. 16) and longitudinal (FIG. 17) cross sections of IC structure 250 are shown to further illustrate features of IC structure 250. As noted elsewhere herein, portions of fins 110, STI(s) 140, and masking layer 200 may be removed by forming trenches T1 (FIGS. 8, 10, 12) and T2 (FIGS. 9, 11, 13) and openings R1 (FIG. 12) and R2 (FIG. 13) therein, such that insulator 240 is formed within the trenches T1, T2 and openings R1, R2. These processing features of the present disclosure may provide related structural distinctions. For instance, as shown in FIG. 16, insulator 240 of SDB region 252 may have a first lateral width W1 within insulator region 160 that is greater than a second lateral width W2 within fin(s) 110. The difference between widths W1, W2 of insulator 240 of SDB region 252 provides an identifying feature of IC structure 250, in addition to increasing the structural stability and/or electrical insulation within fin(s) 110 due to the presence of variable widths and corners within SDB region 252. In addition, as shown in FIG. 17, insulator 240 of end isolation region 254 (FIG. 18 only) may have a first lateral width U1 within masking layer 200 that is greater than a second lateral width U2 within STI(s) 140. The difference between widths U1, U2 of insulator 240 within end isolation region 254 also provides an identifying feature of IC structure 250, in addition to increasing the structural stability and/or electrical insulation of end isolation region 254 by extending at least partially into the surface of STI(s) 140. In addition, insulator 240 of SDB region 252 may have a depth D1 within fin(s) 110 that is significantly greater than a depth D2 of insulator 240 of end isolation region 254 within STI(s) 140. The difference in depths D1, D2 may stem from differences in the etch rate of fin(s) 110 and STI(s) 140 when openings R1, R2 are formed as noted elsewhere herein.

Figure 19:
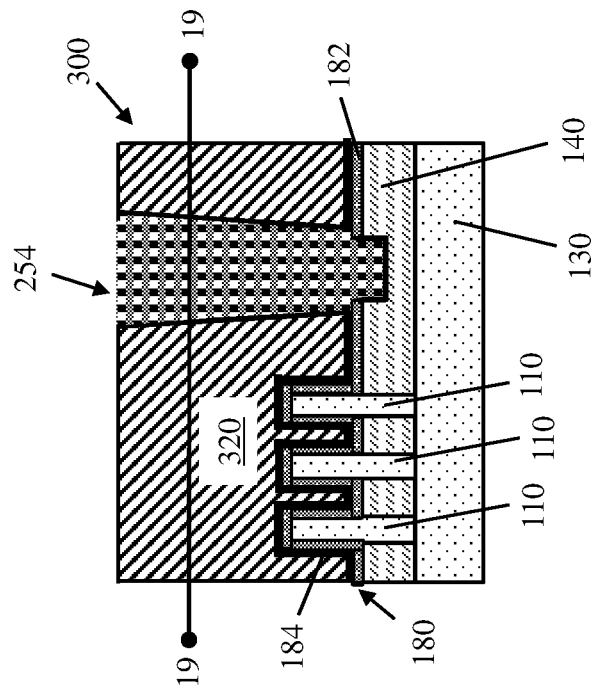
FIG. 19 shows a longitudinal cross-sectional view of an IC structure according to the disclosure.
Figure 18:
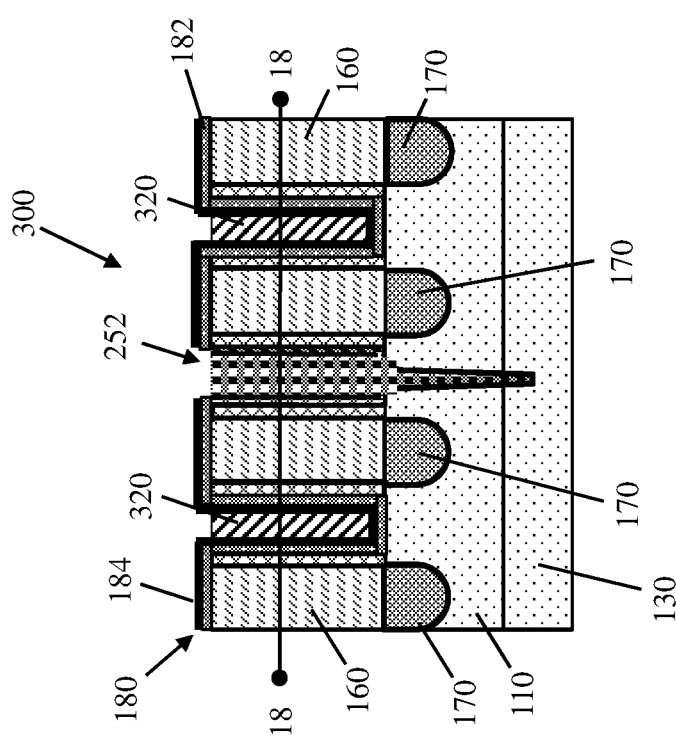
FIG. 18 shows a lateral cross-sectional view of an IC structure according to the disclosure.
Figure 20:
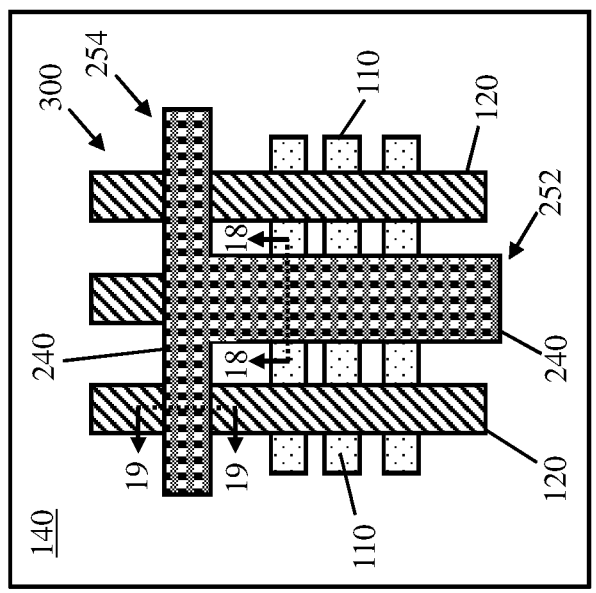
FIG. 20 shows a plan view of an IC structure according to the disclosure.

Referring to FIGS. 18-20, methods according to the disclosure may include further modifying of IC structure 250 to yield an IC structure 300 with metal gates 320 included therein. FIG. 18 depicts a lateral cross-section of FIG. 20 viewed from line 18-18. FIG. 19 depicts a longitudinal cross-section of FIG. 20 viewed from line 19-19. After forming SDB region(s) 252 and end isolation regions 254 together in an integrated method as discussed herein, further processing may include removing masking layer 200 (FIGS. 6-17), e.g., by a selective etching of organic materials to prepare for the subsequent forming of functional gate materials. Removing masking layer 200, in particular, may open lateral space between ILD region(s) 160 where insulator 240 has not been formed. These areas may be filled, e.g., by depositing a gate metal 320 to provide the functional components of a transistor gate structure. IC structure 300 may include remaining portions of gate coating 180, e.g., in the form of gate dielectric layer 182 and high work function metal layer 184 for separating the conductive material in gate metal 320 from an underlying semiconductor region. Gate metal 320 thus may be composed of one or more metals appropriate for providing a gate contact in a FinFET transistor. The deposited gate metal 320 may cover portions of gate coating 180 above each fin 110, in addition to covering portions of STI(s) 140 thereunder. As shown best in FIG. 20, end isolation region 254 may longitudinally separate gate metals 320 from each other, while extending substantially in parallel with fins 110. As also shown in FIG. 20, SDB regions 252 can physically separate and electrically isolate different semiconductor regions of fins 110 from each other. FIG. 19 further illustrates that IC structure 300 may include at least one source/drain region 170 of fin(s) 110 positioned laterally between SDB region(s) 252 and the location of one gate metal 320.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) structure, the method comprising:
  providing a structure including:
    a plurality of fins positioned on a substrate,
    a plurality of shallow trench isolations (STIs) each positioned on the substrate laterally adjacent to one of the plurality of fins, and
    a masking layer positioned on the plurality of fins and the plurality of STIs;
  forming a first trench in the masking layer to expose the plurality of fins, wherein the first trench extends transversely across the plurality of fins;
  forming a second trench within the masking layer to expose one of the plurality of STIs, the second trench extending substantially in parallel with the plurality of fins, and wherein the second trench is positioned at a lateral end of the first trench;
  forming a first opening within at least one of the exposed fins of the first trench to expose the substrate thereunder;
  forming a second opening within the exposed one of the plurality of STIs of the second trench without exposing the substrate thereunder; and
  forming an insulator on the exposed substrate and the exposed one of the plurality of STIs.

2. The method of claim 1, wherein forming the first trench and the second trench within the masking layer includes:
  removing a portion of the masking layer over the plurality of fins and the exposed one of the plurality of STIs; and
  removing a dielectric liner from the plurality of fins and one of the plurality of STIs to expose the plurality of fins or the one of the plurality of STIs thereunder.

3. The method of claim 1, further comprising conformally forming a dielectric liner on the first and second trenches before forming the first opening or the second opening.

4. The method of claim 3, wherein forming the dielectric liner substantially prevents sidewalls of the first and second trenches of the masking layer from being horizontally etched during the forming of the first opening and the second opening.

5. The method of claim 3, wherein the insulator and the dielectric liner have a same material composition.

6. The method of claim 1, wherein a depth of the first opening from an upper surface of the plurality of fins is greater than a depth of the second opening from an upper surface of the one of the plurality of STIs.

7. The method of claim 1, further comprising, after forming the insulator:
   removing the masking layer to expose another portion of the plurality of fins; and
   forming a metal gate over the exposed another portion of the plurality of fins.

8. A method of forming an integrated circuit (IC) structure, the method comprising:
   providing a structure including:
      a plurality of fins positioned on a substrate,
      a plurality of shallow trench isolations (STIs) each positioned on the substrate laterally adjacent to one of the plurality of fins, and
      a set of gate structures positioned on the plurality of fins and extending transversely across the plurality of fins;
   removing the set of gate structures from the structure;
   forming a gate coating on the structure, after removing the set of gate structures;
   forming a masking layer on the gate coating, after removing the set of gate structures;
   forming a first trench within the masking layer to expose a portion of one of the plurality of fins, the first trench extending transversely across the plurality of fins;
   forming a second trench within the masking layer to expose one of the plurality of STIs, the second trench extending substantially in parallel with the plurality of fins, and positioned at a lateral end of the first trench;
   forming a first opening within the exposed portion of one of the plurality fins, within the first trench to expose the substrate thereunder;
   forming a second opening within the exposed one of the plurality of STIs of the second trench without exposing the substrate thereunder; and
   forming an insulator on the exposed substrate and the exposed one of the plurality of STIs.

9. The method of claim 8, wherein forming the first trench and the second trench within the masking layer includes:
   removing a portion of the masking layer over the exposed portion of one the plurality of fins and the exposed one of the plurality of STIs; and
   removing a dielectric liner from the exposed portion of one of the plurality of fins and one of the plurality of STIs to expose the plurality of fins or the one of the plurality of STIs thereunder.

10. The method of claim 8, further comprising conformally forming a dielectric liner on the first and second trenches before forming the first opening or the second opening.

11. The method of claim 10, wherein the dielectric liner protects portions of the masking layer from being removed during the forming of the first opening or the second opening.

12. The method of claim 10, wherein the gate coating includes:
   a gate dielectric layer; and
   a high work function metal positioned on the gate dielectric layer.

13. The method of claim 8, wherein a depth of the first opening from an upper surface of the plurality of fins is greater than a depth of the second opening from an upper surface of the one of the plurality of STIs.

14. The method of claim 8, further comprising, after forming the insulator:
   removing the masking layer to expose another portion of the plurality of fins; and
   forming metal gate over the exposed another portion of the plurality of fins.

* * * * *